(12) United States Patent
Cho et al.

(10) Patent No.: US 12,057,452 B2
(45) Date of Patent: Aug. 6, 2024

(54) ARRAY SUBSTRATE, MANUFACTURING METHOD THEREFOR AND DISPLAY PANEL

(71) Applicant: HKC CORPORATION LIMITED, Shenzhen (CN)

(72) Inventors: En-Tsung Cho, Chongqing (CN); Fengyun Yang, Chongqing (CN); Qionghua Mo, Chongqing (CN); Yong Zhang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 518 days.

(21) Appl. No.: 17/418,259

(22) PCT Filed: Mar. 9, 2020

(86) PCT No.: PCT/CN2020/078390
§ 371 (c)(1),
(2) Date: Jun. 25, 2021

(87) PCT Pub. No.: WO2020/187073
PCT Pub. Date: Sep. 24, 2020

(65) Prior Publication Data
US 2022/0068976 A1    Mar. 3, 2022

(30) Foreign Application Priority Data
Mar. 15, 2019  (CN) .......................... 201910197080.7

(51) Int. Cl.
*H01L 27/12* (2006.01)
*G02F 1/1362* (2006.01)

(52) U.S. Cl.
CPC .... *H01L 27/1222* (2013.01); *G02F 1/136222* (2021.01); *H01L 27/1262* (2013.01)

(58) Field of Classification Search
CPC ............ G02F 1/136222; G02F 1/1345; G02F 1/136286; G02F 1/136254; G02F 1/1368;
(Continued)

(56) References Cited

U.S. PATENT DOCUMENTS 6,529,251 B2 *  3/2003  Hibino .............. G02F 1/136227
                                                    349/122
6,674,502 B1 *  1/2004  Terakado .......... H01L 29/66765
                                                    257/E21.414
(Continued)

FOREIGN PATENT DOCUMENTS

CN        102629609 A    8/2012
CN        103258743 A    8/2013
(Continued)

OTHER PUBLICATIONS

Xixiao Ma, the ISA written comments, Jun. 2020, CN.
Xixiao Ma, the International Search Report, Jun. 2020, CN.

*Primary Examiner* — Mouloucoulaye Inoussa (57) ABSTRACT

The present application discloses an array substrate, a manufacturing method therefor and a display panel. The manufacturing method for the array substrate includes steps of: forming a base layer; forming a semiconductor layer on the base layer; forming a metal layer on the semiconductor layer, where the upper surface of the metal layer contains a first nitride or a first oxide; etching the metal layer into a source/drain electrode; and forming a passivation layer on the source/drain electrode, where the passivation layer is a second nitride structure corresponding to the first nitride or a second oxide structure corresponding to the first oxide.

13 Claims, 7 Drawing Sheets

(58) Field of Classification Search
CPC ........... G02F 1/136227; G02F 1/13629; G02F 2202/103; H01L 27/1248; H01L 27/1222; H01L 27/1262; H01L 27/124; H01L 29/458; H01L 27/1237; H01L 29/78669; H01L 29/66765; H01L 27/127; H01L 27/1214; H01L 29/78618; H01L 27/1288; H01L 29/78678; H01L 27/1259; H01L 27/14685; H01L 27/14692; H01L 27/1462; H01L 27/14663; H01L 31/02161; H01L 27/14636; H01L 27/14603; H01L 31/0203; H01L 31/1055; H01L 27/1461; H01L 27/14612; H01L 29/7869; H01L 29/24; H01L 29/41733; H01L 29/66969; H01L 29/45; H01L 21/3081; H01L 21/32137; H01L 21/32134; H01L 21/02592; H01L 29/78696; H04N 25/63; H04N 5/321; G01T 1/2018; H10K 59/123; H10K 59/1213
USPC ...... 257/43, E21.411, E29.273, E21.409, 72, 257/763, 764, E27.116; 438/104, 158, 438/22, 609; 349/56, 43
See application file for complete search history.

(56) References Cited

U.S. PATENT DOCUMENTS

| | | | |
|---|---|---|---|
| 7,029,727 B1 | 4/2006 | Kokura et al. | |
| 8,354,702 B1* | 1/2013 | Shanker | C01G 23/07 257/E21.267 |
| 8,415,657 B2* | 4/2013 | Rui | C23C 16/405 257/15 |
| 11,393,908 B1* | 7/2022 | Suresha | H01L 23/485 |
| 2002/0126243 A1* | 9/2002 | Hibino | G02F 1/136227 349/122 |
| 2004/0135143 A1* | 7/2004 | Harano | H01L 21/28568 257/E29.147 |
| 2007/0019126 A1* | 1/2007 | Rhee | G02F 1/1362 349/56 |
| 2009/0325331 A1* | 12/2009 | Yang | H01L 27/1288 438/609 |
| 2011/0204475 A1* | 8/2011 | Rui | C23C 16/0272 257/532 |
| 2013/0056729 A1* | 3/2013 | Misaki | H01L 27/1225 257/43 |
| 2016/0233322 A1* | 8/2016 | Yeh | H01L 21/02565 |
| 2017/0117298 A1* | 4/2017 | Cha | H01L 21/02175 |
| 2017/0352689 A1* | 12/2017 | Chung | G02F 1/1368 |
| 2019/0355774 A1* | 11/2019 | Misaki | H01L 27/14663 |
| 2020/0006574 A1* | 1/2020 | Cho | H01L 29/41733 |
| 2020/0135767 A1* | 4/2020 | Ge | H01L 29/66765 |
| 2020/0176505 A1* | 6/2020 | Misaki | H01L 27/14632 |
| 2020/0343272 A1* | 10/2020 | Misaki | G02F 1/136286 |
| 2021/0111218 A1* | 4/2021 | Nakamura | G01T 1/20184 |
| 2021/0119007 A1* | 4/2021 | Misaki | G02F 1/1368 |
| 2021/0327913 A1* | 10/2021 | Cho | H01L 29/458 |
| 2021/0391360 A1* | 12/2021 | Misaki | H01L 27/14685 |
| 2021/0399110 A1* | 12/2021 | Hu | H01L 29/66742 |
| 2022/0057683 A1* | 2/2022 | Nakui | G02F 1/1345 |
| 2022/0223423 A1* | 7/2022 | Li | H01L 29/456 |
| 2023/0143351 A1* | 5/2023 | Yu | H10K 59/126 257/59 |

FOREIGN PATENT DOCUMENTS

| | | |
|---|---|---|
| CN | 108646487 A | 10/2018 |
| CN | 108987418 A | 12/2018 |
| CN | 109979946 A | 7/2019 |

* cited by examiner

ARRAY SUBSTRATE, MANUFACTURING METHOD THEREFOR AND DISPLAY PANEL

CROSS REFERENCE OF RELATED APPLICATIONS

This present application claims the priority to the Chinese Patent Application No. CN201910197080.7, filed with National Intellectual Property Administration, PRC on Mar. 15, 2019 and entitled "ARRAY SUBSTRATE, MANUFACTURING METHOD THEREFOR AND DISPLAY PANEL", which is incorporated herein by reference in its entirety.

TECHNICAL FIELD

The present application relates to the technical field of display, particularly to an array substrate, a manufacturing method therefor and a display panel.

BACKGROUND

The statements herein merely provide background information related to the present application and do not necessarily constitute the conventional art.

As a main medium for transmitting information, Liquid Crystal Display (LCD) have been widely used in various fields of work and life. But few people know that the production of the seemingly simple LCD panels requires hundreds of processes. Generally, an LCD panel consists of an array substrate including active components such as thin film transistors, a CF substrate including components such as color filters, and a liquid crystal cell sandwiched therebetween, and a transparent electrode layer on the surface of the array substrate is to be connected to a metal layer in an active switch.

In the manufacturing of the array substrate, passivation undercut occurs easily to the passivation layer on the surface of the metal layer during etching to form contact holes, which may directly lead to abnormal display of the LCD panel in severe cases.

SUMMARY

The purpose of the present application is to provide an array substrate, a manufacturing method therefor and a display panel to improve passivation undercut of a passivation layer.

To achieve the purpose, the present application discloses a manufacturing method for an array substrate, including steps of:
  forming a base layer;
  forming a semiconductor layer on the base layer;
  forming a metal layer on the semiconductor layer, where the upper surface of the metal layer contains a first nitride or a first oxide;
  etching the metal layer into a source/drain electrode; and
  forming a passivation layer on the source/drain electrode, where the passivation layer is a second nitride structure corresponding to the first nitride or a second oxide structure corresponding to the first oxide.

The present application further discloses an array substrate, including: a base layer; a semiconductor layer disposed on the base layer; a metal layer disposed on the semiconductor layer and etched into a source/drain electrode, where the upper surface of the metal layer contains a first nitride or a first oxide; and a passivation layer disposed on the source/drain electrode, where the passivation layer is a second nitride structure corresponding to the first nitride or a second oxide structure corresponding to the first oxide.

The present application further discloses a display panel, including a CF substrate and an array substrate which are arranged oppositely, and a liquid crystal layer arranged between the CF substrate and the array substrate, where the array substrate includes a base layer, a semiconductor layer, a metal layer and a passivation layer, and the semiconductor layer is disposed on the base layer; the metal layer is disposed on the semiconductor layer and etched into a source/drain electrode, where the upper surface of the metal layer contains a first nitride or a first oxide; the passivation layer is disposed on the source/drain electrode and is a second nitride structure corresponding to the first nitride or a second oxide structure corresponding to the first oxide.

Compared with solutions in which the source/drain electrode does not contain a first nitride or a first oxide, the upper surface of the source/drain electrode contains a first nitride or a first oxide in the present application. When a passivation layer consisting of a second nitride structure corresponding to the first nitride or a second oxide structure corresponding to the first oxide is deposited on the source/drain electrode, the two nitrogen-containing structures or oxygen-containing structures produce adsorption affinity, so that the passivation layer is fitted more closely to the source/drain electrode. In this way, during etching, passivation undercut is less likely to occur at the fitting position of the passivation layer and the source/drain electrode, thereby improving the yield of the display panel.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "transverse", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

Figure 1:
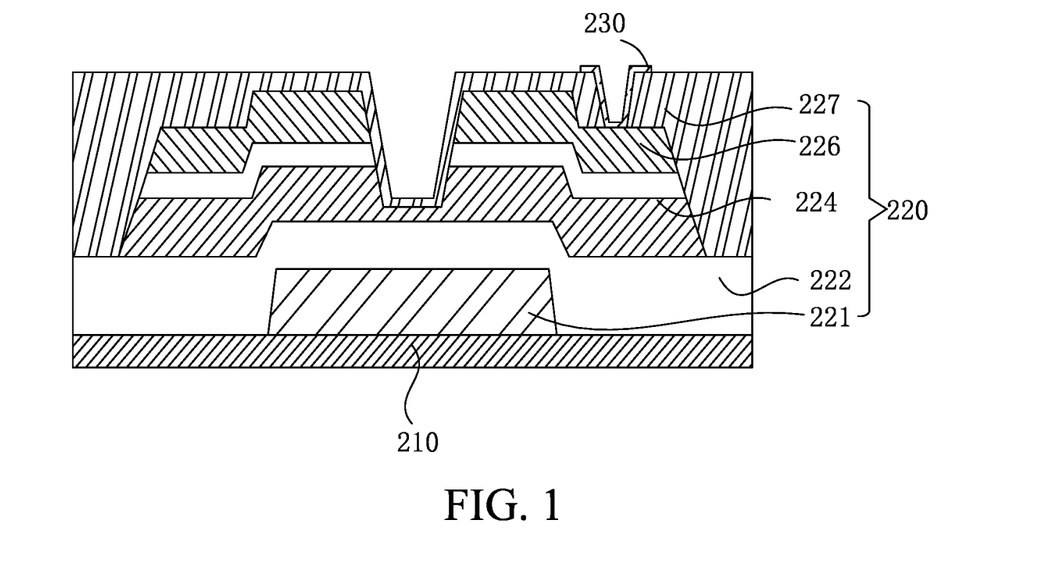
FIG. 1 is a schematic diagram of an active switch.

FIG. 1 is a schematic diagram of an array substrate 200. As shown in FIG. 1, the array substrate 200 known to the inventor includes an active switch 220, a substrate 210 and a transparent electrode layer 230, where the active switch 220 is disposed between the substrate 210 and the transparent electrode layer 230; a gate metal layer 221, a gate insulating layer 222, a semiconductor layer 224, a source/drain electrode 226 and a passivation layer 227 are disposed sequentially in a direction away from the substrate 210; the passivation layer 227 is etched to form a via hole, and the transparent electrode layer 230 is connected to the drain electrode through the via hole, however, passivation undercut occurs easily to the via hole during etching.

Figure 2:
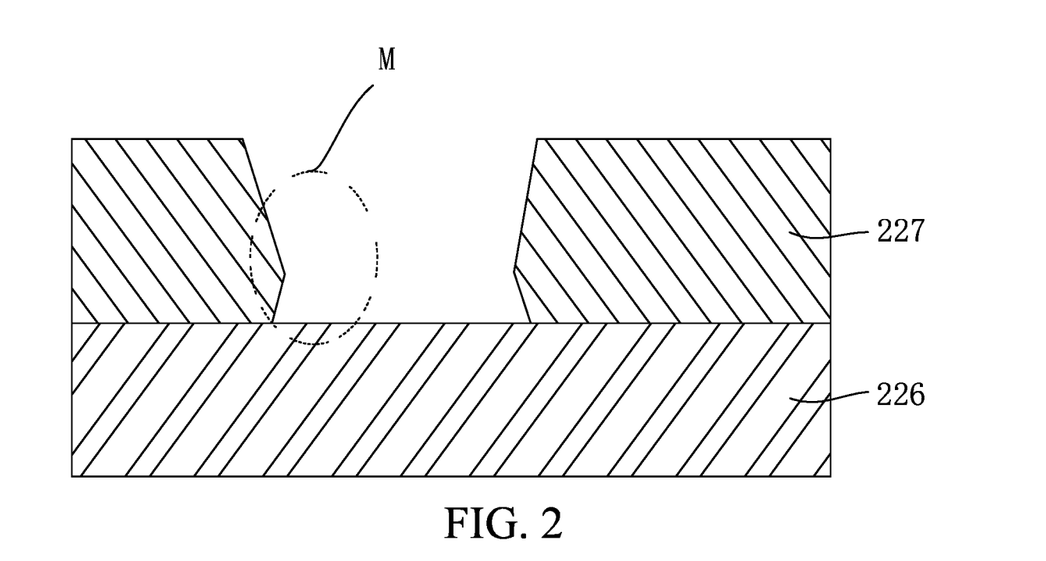
FIG. 2 is a schematic diagram of a passivation undercut phenomenon on a passivation layer.

FIG. 2 is a schematic diagram of passivation undercut on the passivation layer 227, where M is passivation undercut on the passivation layer 227, which may directly lead to abnormal display of the display panel 100 in severe cases, and slight passivation undercut may become a latent problem, which may lead to problems such as dark spots on the display panel 100 in use, affecting the quality of the display panel 100.

Figure 3:
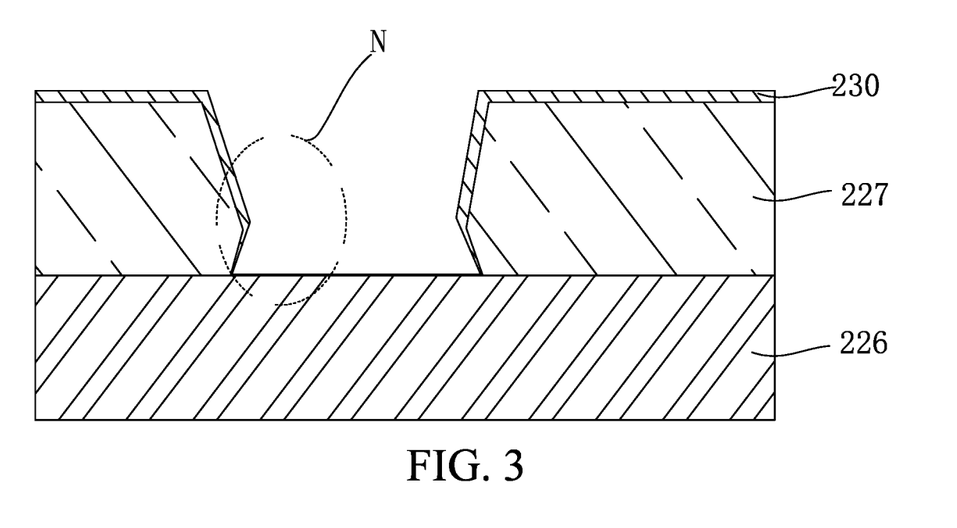
FIG. 3 is a schematic diagram of another passivation undercut phenomenon on a passivation layer.

FIG. 3 is a schematic diagram of the transparent electrode layer 230 laid on the passivation layer 227 with passivation undercut, where N is a portion of the transparent electrode layer 230 affected by passivation undercut. As can be seen from the figure, the thickness of the transparent electrode layer 230 in the via hole is not uniform, and even the transparent electrode layer 230 on the passivation layer 227 with passivation undercut may be broken, which may lead to problems such as abnormal display of the display panel 100.

The present application will now be further described by reference to the accompanying drawings and optional embodiments.

Figure 4:
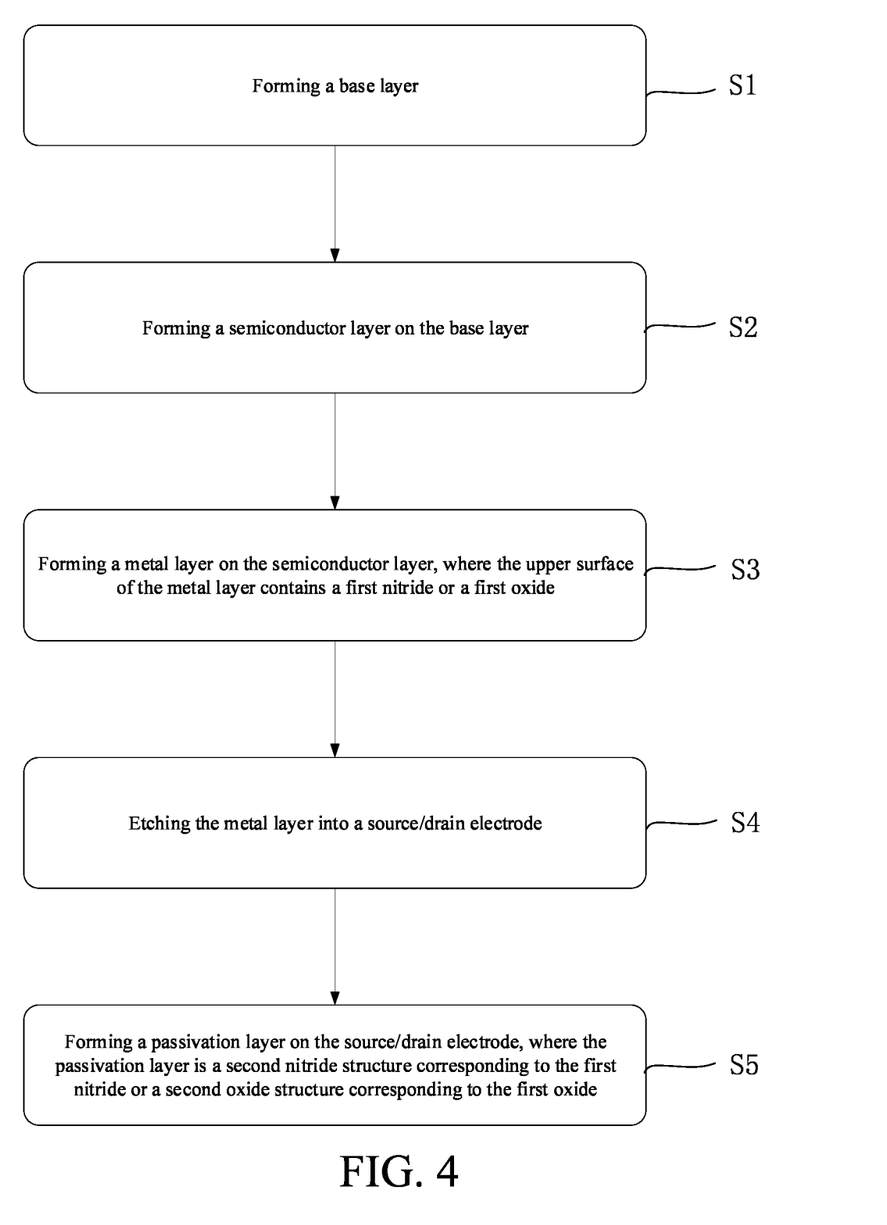
FIG. 4 is a flowchart of a manufacturing method for an array substrate according to an embodiment of the present application.

FIG. 4 is a flowchart of a manufacturing method of an array substrate 200. As shown in FIG. 4, an embodiment of the present application discloses a manufacturing method of an array substrate 200, including steps of:

S1: forming a base layer;

S2: forming a semiconductor layer on the base layer;

S3: forming a metal layer on the semiconductor layer, where the upper surface of the metal layer contains a first nitride or a first oxide;

S4: etching the metal layer into a source/drain electrode; and

S5: forming a passivation layer on the source/drain electrode, where the passivation layer is a second nitride structure corresponding to the first nitride or a second oxide structure corresponding to the first oxide.

In the present application, the upper surface of the source/drain electrode 226 contains a first nitride or a first oxide, and when the passivation layer 227 consisting of a second nitride structure corresponding to the first nitride or a second oxide structure corresponding to the first oxide is deposited on the source/drain electrode 226, nitrogen atoms in the two nitrogen-containing structures or oxygen atoms in the two oxygen-containing structures may attract each other because van der Waals' force between the identical atoms is larger than that between different atoms, so that the passivation layer 227 and the source/drain electrode 226 produce adsorption affinity, the passivation layer 227 is fitted more closely to the source/drain electrode 226. In this way, during etching, passivation undercut is less likely to occur at the fitting position of the passivation layer 227 and the source/drain electrode 226, thereby improving the yield of the display panel 100.

The base layer 223 includes a substrate 210, a gate metal layer 221 and a gate insulating layer 222, where the gate metal layer 221 is disposed on the substrate 210, the gate insulating layer 222 is disposed on the gate metal layer 221, and a semiconductor layer 224 is disposed on the gate metal layer 221, where the semiconductor layer 224 includes an active layer and an ohmic contact layer, or the semiconductor layer 224 includes only an active layer.

Specifically, only one etching process is required to form the source/drain electrode 226 containing a first nitride layer or a first oxide layer, and it is not required to etch the metal layer 225 and the first nitride layer or the first oxide layer separately, thereby saving the whole process time of the active switch 220.

Figure 5:
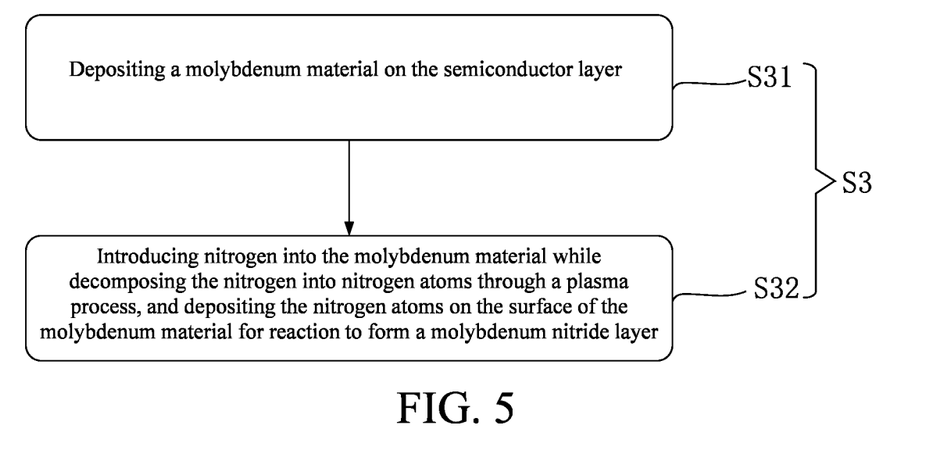
FIG. 5 is a flowchart of a manufacturing method for an array substrate based on FIG. 4 according to the present application.

FIG. 5 is a flowchart of a method based on step S3. As shown in FIG. 5, in one or more embodiments, the metal layer 225 includes a metal base layer 2251 disposed on the semiconductor layer 224 and a first nitride layer disposed on the metal base layer 2251, the first nitride layer is a molybdenum nitride layer 2254, and the passivation layer 227 is a nitride structure; step S3 includes steps of:

S31: depositing a molybdenum material on the semiconductor layer; and

S32: introducing nitrogen into the molybdenum material while decomposing the nitrogen into nitrogen atoms through a plasma process, and depositing the nitrogen atoms on the surface of the molybdenum material for reaction to form a molybdenum nitride layer.

The nitrogen is decomposed into nitrogen atoms by the plasma process, and the nitrogen atoms bind to the molybdenum material to form the molybdenum nitride layer 2254. Since the nitrogen atoms only react with the surface of the molybdenum material during the process, the resulting molybdenum nitride layer 2254 is very thin, and the nitride layer hardly increases the overall etching time when the entire metal layer 225 is etched, so that the productivity of the array substrate 200 is not affected. In step S32, the plasma process is performed by Plasma Enhanced Chemical Vapor Deposition (PECVD).

Figure 6:
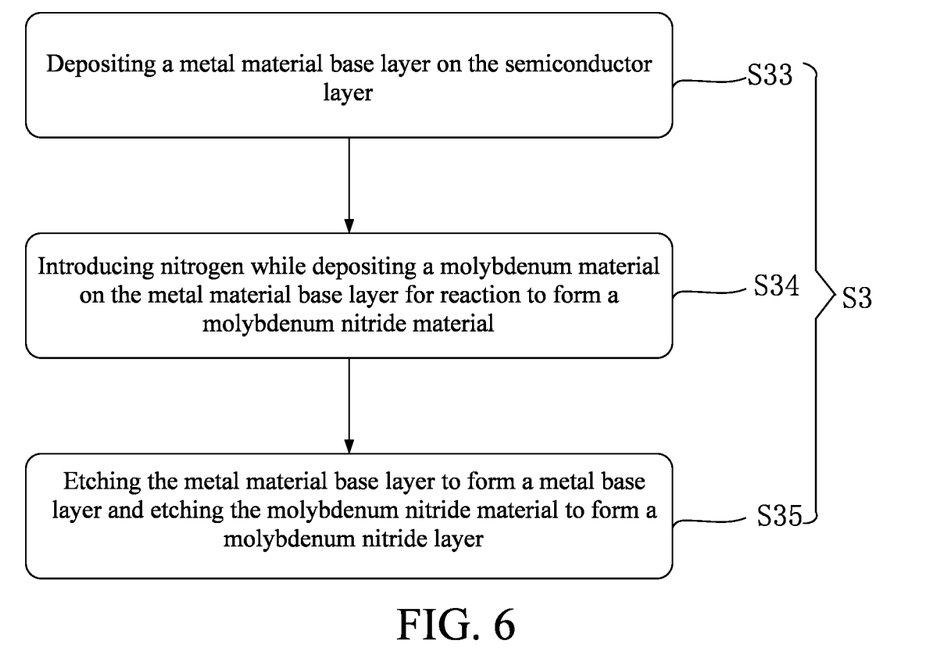
FIG. 6 is a flowchart of a manufacturing method for another array substrate based on FIG. 4 according to the present application.

FIG. 6 is also a flowchart of a method based on step S3. As shown in FIG. 6, in one or more embodiments, the metal layer 225 includes a metal base layer 2251 disposed on the semiconductor layer 224 and a first nitride layer disposed on the metal base layer 2251, the first nitride layer is a molybdenum nitride layer 2254, and the passivation layer 227 is a nitride structure; step S3 includes steps of:

S33: depositing a metal material base layer on the semiconductor layer;

S34: introducing nitrogen while depositing a molybdenum material on the metal material base layer for reaction to form a molybdenum nitride material; and S35: etching the metal material base layer to form a metal base layer and etching the molybdenum nitride material to form a molybdenum nitride layer.

By introducing nitrogen while depositing the metal material to form the molybdenum nitride material, the process of generating the molybdenum nitride material does not take up the time of depositing the metal material, and the whole process time of the array substrate 200 is not prolonged due to the additional process of the molybdenum nitride layer 2254, so that the array substrate 200 in the present application can improve passivation undercut of the passivation layer 227, and can improve the production efficiency, thus improving the productivity. In step S34, the molybdenum material is deposited by Physical Vapor Deposition (PVD), in which a molybdenum target is laid first, and then the target is impacted by high-speed electrons to impact molybdenum atoms from the target. When the separated molybdenum atoms come into contact with nitrogen, the covalent bonds between nitrogen atoms and nitrogen atoms are easily dissociated, so that the molybdenum atoms and the nitrogen atoms bind and react to form molybdenum nitride.

Of course, the molybdenum nitride layer 2254 may also be a molybdenum oxide layer, and the nitrogen in step S34 is replaced by oxygen based on the molybdenum oxide layer, so that the oxygen reacts with the molybdenum material to form molybdenum oxide which is etched to form the molybdenum oxide layer, and the passivation layer 227 is an oxide structure, such as silicon oxide, which also enables the metal layer 225 and the passivation layer 227 to produce adsorption affinity, thereby improving passivation undercut of the passivation layer 227.

Figure 7:
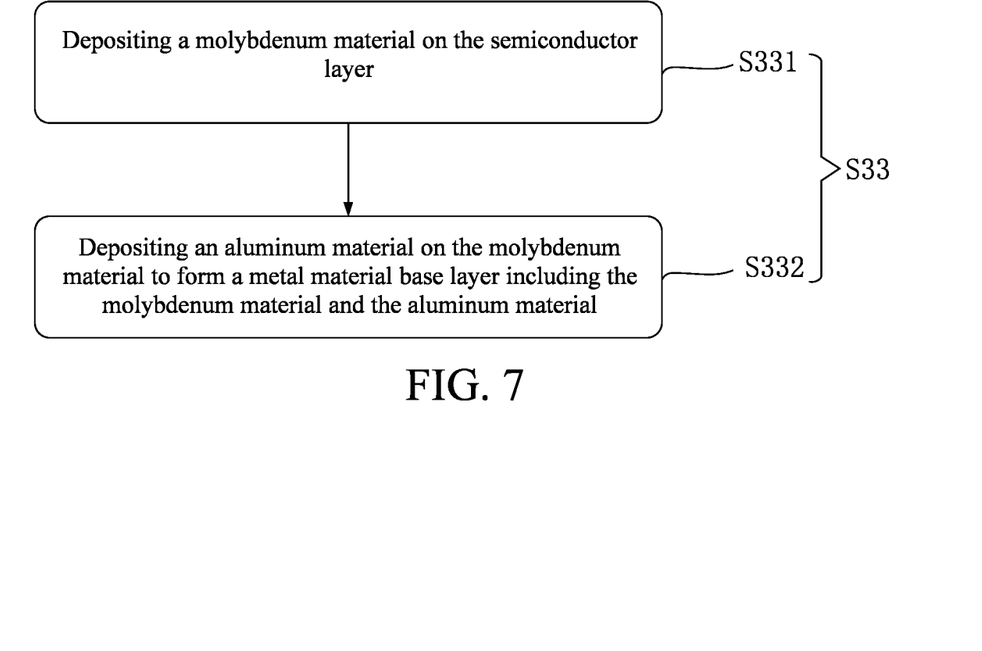
FIG. 7 is a flowchart of a manufacturing method for another array substrate based on FIG. 6 according to the present application.

FIG. 7 is a flowchart of a method based on step S33. As shown in FIG. 7, in one or more embodiments, step S33 includes steps of:

S331: depositing a molybdenum material on the semiconductor layer; and

S332: depositing an aluminum material on the molybdenum material to form a metal material base layer including the molybdenum material and the aluminum material;

Step S35 includes steps of: etching the molybdenum material to form a molybdenum layer, and etching the aluminum material to form an aluminum layer to obtain a metal base layer including the molybdenum layer and the aluminum layer.

Here, the metal substrate 2251 is formed into two metal material layers, i.e., a molybdenum layer 2252 disposed on the semiconductor layer 224 and an aluminum layer 2253 disposed on the molybdenum layer 2252. The structure is adopted because aluminum has good conductivity, so that the transmission effect is better. The layer disposed on the molybdenum layer 2252 is not limited to the aluminum layer 2253, and other metals with good conductivity are also applicable to the metal base layer 2251 in the present application, such as a copper layer. The molybdenum layer 2252 between the aluminum layer 2253 and the semiconductor layer 224 and the molybdenum nitride layer 2254 above the aluminum layer 2253 play a role in protecting the aluminum layer 2253 from corrosion because the molybdenum material and the molybdenum nitride material are stable and less likely to react, and the protection of the aluminum layer 2253 by the molybdenum layer 2252 and the molybdenum nitride layer 2254 can prolong the service life of the entire array substrate 200 and the display panel 100. The molybdenum layer 2252 in the present application may also be replaced by other metal layers, and metal materials that can play the identical role as molybdenum are allowed, such as titanium (Ti) and tantalum (Ta). Correspondingly, the molybdenum material in step S34 may also be a titanium material or a tantalum material. When the introduced gas is nitrogen, a titanium nitride layer or a tantalum nitride layer is generated correspondingly; when the introduced gas is oxygen, a titanium oxide layer or a tantalum oxide layer is generated correspondingly.

In addition, the metal substrate 2251 can be formed into a single molybdenum layer 2252 or a single aluminum layer 2253 or even other metal layers, but not limited to a two-layer structure, so that only one process is required to complete the metal base layer 2251, thereby reducing process steps. The metal substrate 2251 can also be formed into three or more metal film layers, which is not limited herein.

In addition, nitrogen can also be introduced while depositing different film layers of the metal substrate 2251 to increase the concentration of nitrogen, improve the adsorption affinity between different film layers in the metal base layer 2251, and avoid passivation undercut of different film layers during etching, for example, when the molybdenum layer 2252 and the aluminum layer 2253 are formed, nitrogen can also be introduced to enable the molybdenum layer 2252 and the aluminum layer 2253 to contain nitride, so as to increase the adsorption affinity between the molybdenum layer 2252 and the aluminum layer 2253. Of course, the metal layer 225 of the present application can also be a molybdenum nitride layer 2254 as a whole, rather than merely a molybdenum nitride layer 2254 formed on the upper surface of the metal layer 225.

In one or more embodiments, step S34 includes steps of introducing nitrogen at a first flow rate while depositing the molybdenum material on the metal material base layer for reaction to form a first molybdenum nitride material, introducing nitrogen at a second flow rate for reaction to form a second molybdenum nitride material, and introducing nitrogen at a third flow rate for reaction to form a third molybdenum nitride material; and the step of etching the metal material base layer to form the metal base layer 2251 and etching the molybdenum nitride material to form the molybdenum nitride layer 2254 includes steps of etching the first molybdenum nitride material to form a first molybdenum nitride layer 2255, etching the second molybdenum nitride material to form a second molybdenum nitride layer 2256, and etching the third molybdenum nitride material to form a third molybdenum nitride layer 2257; where the first flow rate is 200 ml/min, the third flow rate is 1000 ml/min, and the second flow rate is less than the third flow rate.

The molar mass of nitrogen in the molybdenum nitride is changed by changing the flow rate of introduced nitrogen. When the flow rate at which nitrogen is introduced is small, the molar mass of nitrogen in the molybdenum nitride produced is lower; and when the flow rate at which nitrogen is introduced is large, the molar mass of nitrogen in the molybdenum nitride produced is higher. When the molar mass of nitrogen in the molybdenum nitride is larger, the molybdenum nitride layer 2254 has a better adsorption effect with the passivation layer 227, so that the metal layer 225 can be fitted more closely to the passivation layer 227, and passivation undercut on the passivation layer 227 can be better improved. In order to ensure good fitting between the metal layer 225 and the passivation layer 227, and ensure the metal layer 225 can be easily etched, the flow rate at which nitrogen is introduced is adjusted to a controllable state, and the flow rate of the nitrogen is controlled between 200 ml/min and 1000 ml/min so as to avoid etching difficulties and waste of nitrogen due to high nitrogen content, and avoid the situation that the nitrogen content is too low and the adsorption is too weak to improve passivation undercut. Therefore, the introduced nitrogen is controlled within a certain range, so that the nitrogen can react well with molybdenum and achieve a good adsorption effect together with the passivation layer 227. The first flow rate, the second flow rate and the third flow rate are 200 ml/min to 1000 ml/min, the first flow rate is not limited to 200 ml/min, for example, the first flow rate can also be 400 ml/min, the third flow rate is not limited to 1000 ml/min, for example, the third flow rate can also be 800 ml/min; and the corresponding second flow rate can be 500 ml/min or 600 ml/min.

In one or more embodiments, the flow rate at which nitrogen is introduced changes from low flow rate to high flow rate. This results in a lower molar mass of nitrogen in the molybdenum nitride layer 2254 close to the semiconductor layer, and a higher molar mass of nitrogen in the molybdenum nitride layer 2254 close to the passivation layer 227, in which case the adsorption affinity between the passivation layer 227 and the metal layer 225 is high. When the metal layer 225 is etched, the lower the molar mass of nitrogen in the molybdenum nitride layer 2254 is, the easier it is to etch the metal layer 225, which is beneficial to improving passivation undercut while trying to avoid affecting the production efficiency due to slow etching.

The present application provides two methods of changing nitrogen from low flow rate to high flow rate, one method is that the flow rate at which nitrogen is introduced is gradually changed, that is, the flow rate at which nitrogen is introduced changes from low flow rate to high flow rate when the metal layer 225 is deposited, and the changing process is relatively slow, rather than a sudden increase, which results in no distinct layering boundary of the resulting molybdenum nitride layer 2254, for example, the nitrogen flow rate is gradually increased by 1 ml/min. In this way, it can be seen that only a one-layer molybdenum nitride structure is finally formed, although the molar mass of nitrogen in the molybdenum nitride structure gradually increases from bottom to top, the bottom here refers to the direction close to the semiconductor layer 224, and the top here refers to the direction close to the passivation layer 227. When the metal layer 225 structure formed by the method is etched, the nitrogen content is gradually changed, so that passivation undercut is less likely to occur, there is no obvious gap, and the surface of the etched pattern is relatively flat. When the passivation layer 227 is formed on the metal layer 225, the thickness of the passivation layer 227 is relatively uniform, so that the thickness of the transparent electrode layer 230 above the passivation layer 227 is uniform, disconnection of the transparent electrode layer 230 is improved, and the display effect of the display panel 100 is improved. By the method, nitrogen can be introduced in multiple time periods with equal flow in each time period and a small difference in introduced flow in two adjacent time periods, so that the effect of gradual change in nitrogen flow rate can be achieved.

The other method is to divide the time of introducing nitrogen into at least three time periods, where the flow of introduced nitrogen in each time period is equal, and the flow of introduced nitrogen in the later time period is larger than that of introduced nitrogen in the former time period. This results in a multilayer molybdenum nitride layer 2254 structure with clear boundary between adjacent molybdenum nitride layers 2254, since the molar mass of nitrogen in different molybdenum nitride layers 2254 changes successively, thereby reducing the difference in nitrogen content between molybdenum nitride layers 2254 and avoiding passivation undercut between different film layers of the metal layer itself. With the layered molybdenum nitride structure, the flow rate at which nitrogen is introduced can be well controlled, and it is only required to regulate the flow rate of nitrogen once in each time period, so that the operation is easy to control.

In one or more embodiments, the first molybdenum nitride layer 2255, the second molybdenum nitride layer 2256 and the third molybdenum nitride layer 2257 have the identical thickness. As a parameter of film layers, the thickness can be set directly during deposition without worrying about deviation in the thickness of the final film layer, so that two steps of adjusting thickness parameters can be omitted by setting the first molybdenum nitride layer 2255, the second molybdenum nitride layer 2256 and the third molybdenum nitride layer 2257 to the identical thickness, that is, if the thickness parameters are set when the first molybdenum nitride layer 2255 is deposited, it is not required to adjust the thickness when the second molybdenum nitride layer 2256 and the third molybdenum nitride layer 2257 are deposited, thereby saving time. In addition, the three molybdenum nitride layers 2254 have the identical thickness, so that the patterns formed during etching of the molybdenum nitride layers 2254 are relatively uniform.

In one or more embodiments, the first molybdenum nitride layer 2255 and the second molybdenum nitride layer 2256 are thinner than the third molybdenum nitride layer 2257. The third molybdenum nitride layer 2257 is fitted to the passivation layer 227. If the third molybdenum nitride layer is too thin, the absorption effect on the passivation layer 227 is poor, so it is necessary to keep the third passivation layer 227 at a certain thickness, whereas the requirements for the thickness of the first molybdenum nitride layer 2255 and the second molybdenum nitride layer 2256 are lower. If the first molybdenum nitride layer 2255 and the second molybdenum nitride layer 2256 are thinner than the third molybdenum nitride layer 2257, the etching time is short when the entire molybdenum nitride layer 2254 is etched.

In the above embodiment, the thickness parameter of the molybdenum nitride layer 2254 is set at 10 nm, which does not affect the adsorption effect between the molybdenum nitride layer 2254 and the passivation layer 227. If the molybdenum nitride layer 2254 is too thin, the adsorption effect between the molybdenum nitride layer 2254 and the passivation layer 227 will be reduced, so that the effect of improving passivation undercut on the passivation layer 227 is not very obvious. If the molybdenum nitride layer 2254 is too thick, stress on the molybdenum nitride layer 2254 increases, and the adsorption affinity with the metal layer 225 or the semiconductor layer 224 below the molybdenum nitride layer 2254 decreases, resulting in etching of the molybdenum nitride layer 2254 or the metal layer 225. Tests have shown that when the thickness of the molybdenum nitride layer 2254 is set at 10 nm, there is good adsorption affinity between the molybdenum nitride layer 2254 and the passivation layer 227 without generating large stresses. It is also possible to exclusively set the thickness of the molybdenum nitride layer 2254 that is fitted to the passivation layer 227 at 10 nm, i.e., the thickness of the third molybdenum nitride layer 2257 is 10 nm, and the thickness of the first molybdenum nitride layer 2255 and the second molybdenum nitride layer 2256 is less than 10 nm, so that the etching rate of the molybdenum nitride layer 2254 can be accelerated and the productivity can be improved. In addition, the first molybdenum nitride layer 2255 can be thinner than the second molybdenum nitride layer 2256, so that the thickness of the molybdenum nitride layer 2254 gradually increases along the direction from the semiconductor layer 224 to the passivation layer 227, enabling the process of the molybdenum nitride layer 2254 to be accelerated.

Figure 8:
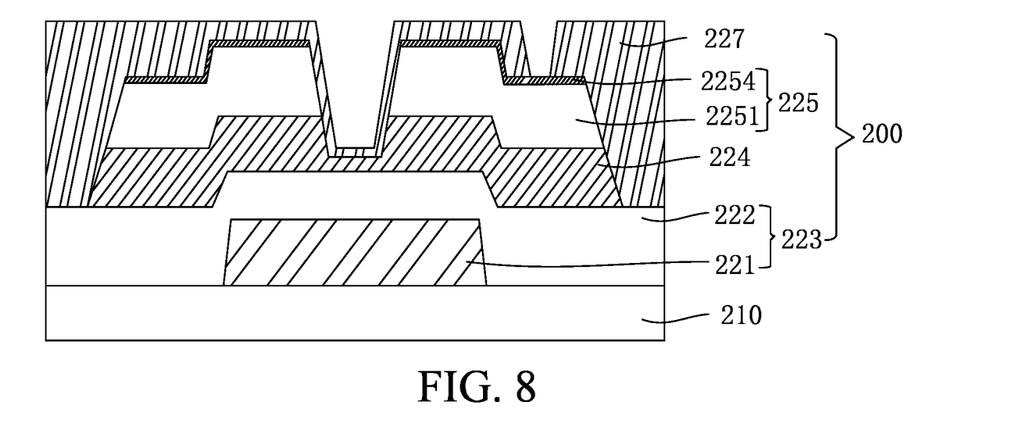
FIG. 8 is a schematic diagram of an array substrate according to an embodiment of the present application.

FIG. 8 is a schematic diagram of an array substrate 200. As shown in FIG. 8, another embodiment of the present application discloses an array substrate 200, including a base layer 223, a semiconductor layer 224, a metal layer 225 and a passivation layer 227, where the semiconductor layer 224 is disposed on the base layer 223, the metal layer 225 is disposed on the semiconductor layer 224 and etched into a source/drain electrode 226, where the upper surface of the metal layer 225 contains a first nitride or a first oxide; and the passivation layer 227 is disposed on the source/drain electrode 226, where the passivation layer 227 is a second nitride structure corresponding to the first nitride or a second oxide structure corresponding to the first oxide.

In one or more embodiments, the metal layer 225 includes a metal base layer 2251 and a molybdenum nitride layer 2254, the metal base layer 2251 is disposed on the semiconductor layer 224, the molybdenum nitride layer 2254 is disposed on the metal base layer 2251 and fitted to the passivation layer 227, and the passivation layer 227 is a nitride structure. Since the source/drain electrode 226 consists of the metal base layer 2251 and the molybdenum nitride layer 2254 which are stacked, the thickness requirement for the molybdenum nitride layer 2254 is low, and it is not required to introduce a large amount of nitrogen, which can save the cost of nitrogen; in addition, the molybdenum nitride layer 2254 can also be a titanium nitride layer or a tantalum nitride layer. The metal layer 225 herein may further include a metal base layer 2251 and a molybdenum oxide layer, the metal base 2251 is disposed on the semiconductor layer 224, the molybdenum oxide layer is disposed on the metal base layer 2251 and fitted to the passivation layer 227, and the passivation layer 227 is an oxide structure, in which case the molybdenum oxide layer may be a titanium oxide layer or a tantalum oxide layer.

Figure 9:
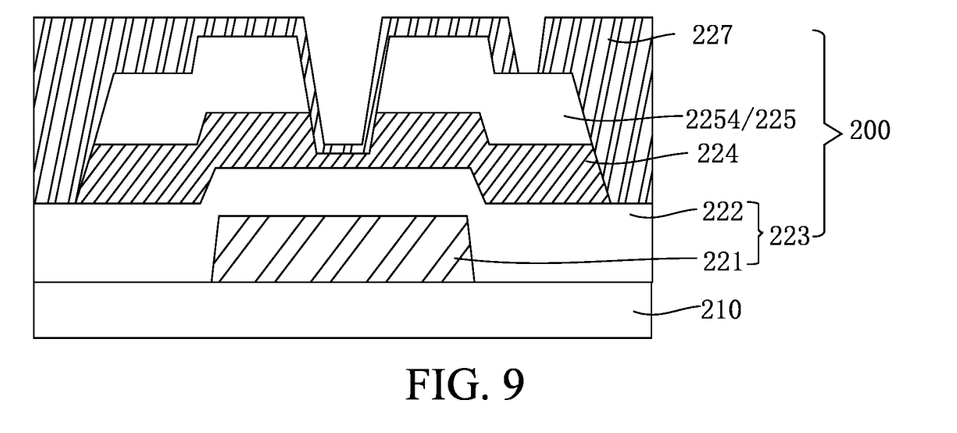
FIG. 9 is a schematic diagram of an array substrate according to another embodiment of the present application.

FIG. 9 is a schematic diagram of another array substrate 200. As shown in FIG. 9, in one or more embodiments, the metal layer 225 is a molybdenum nitride layer 2254. The entire metal layer 225 and the entire source/drain electrode 226 are a single-layer molybdenum nitride structure, in which the molybdenum nitride layer 2254 is formed by introducing nitrogen while depositing a molybdenum material, the process of the molybdenum nitride layer 2254 does not take up other process time and can maximize the productivity. In addition, since the entire metal layer 225 is a molybdenum nitride layer 2254 with a high nitrogen content and good adsorption effect on the passivation layer 227, the effect of improving passivation undercut on the passivation layer 227 is good.

Figure 10:
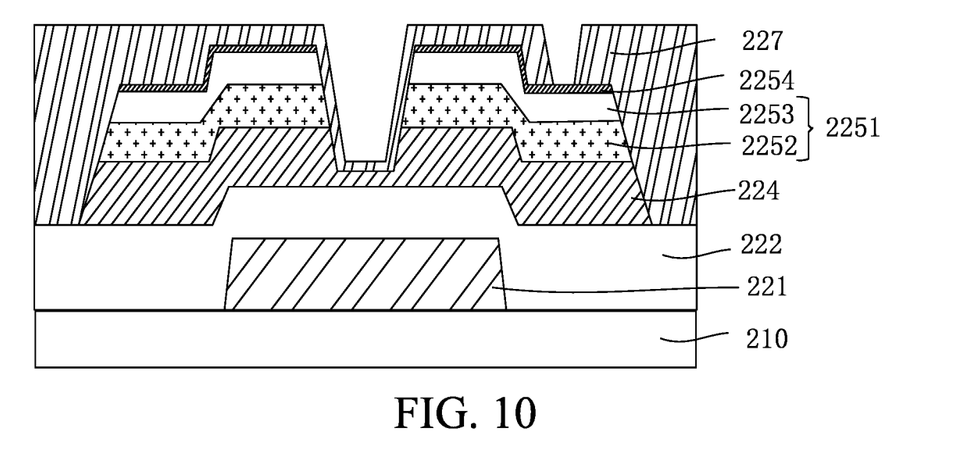
FIG. 10 is a schematic diagram of an array substrate according to another embodiment of the present application.

FIG. 10 is a schematic diagram of another array substrate 200. As shown in FIG. 10, in one or more embodiments, a metal base layer 2251 includes a molybdenum layer 2252 and an aluminum layer 2253, the molybdenum layer 2252 is disposed on the semiconductor layer 224, the aluminum layer 2253 is disposed on the molybdenum layer 2252, and a molybdenum nitride layer 2254 is disposed on the aluminum layer 2253. The signal transmission effect of the source/drain electrode 226 can be improved by disposing the aluminum layer 2253 on the metal substrate 2251 because aluminum has good conductivity. In addition, the molybdenum layer 2252 and the molybdenum nitride layer 2254 are disposed on both sides of the aluminum layer 2253, which can protect the aluminum layer 2253 from corrosion.

Figure 11:
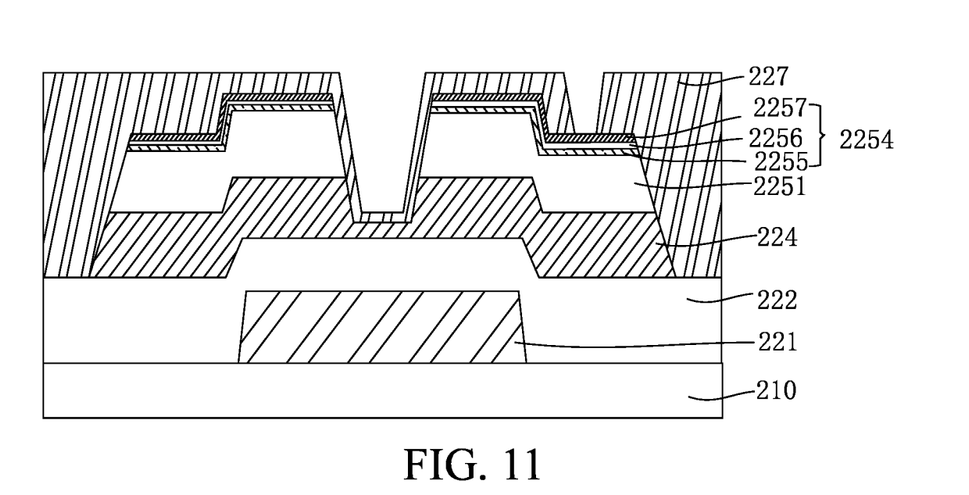
FIG. 11 is a schematic diagram of an array substrate according to another embodiment of the present application.

FIG. 11 is a schematic diagram of another array substrate 200. As shown in FIG. 11, in one or more embodiments, the molybdenum nitride layer 2254 includes a first molybdenum nitride layer 2255, a second molybdenum nitride layer 2256 and a third molybdenum nitride layer 2257; the first molybdenum nitride layer 2255 is disposed on the metal base layer 2251, the second molybdenum nitride layer 2256 is disposed on the first molybdenum nitride layer 2255, and the third molybdenum nitride layer 2257 is disposed on the second molybdenum nitride layer 2256, the molar mass of nitrogen in the first molybdenum nitride layer 2255 is lower than that of nitrogen in the second molybdenum nitride layer 2256, and the molar mass of nitrogen in the second molybdenum nitride layer 2256 is lower than that of nitrogen in the third molybdenum nitride layer 2257. When the molar mass of nitrogen in the molybdenum nitride is high, the adsorption effect of the molybdenum nitride layer 2254 and the passivation layer 227 is good, so that the metal layer 225 can be fitted more closely to the passivation layer 227, and passivation undercut on the passivation layer 227 can be better improved, but high molar mass of nitrogen in the molybdenum nitride layer 2254 causes the etching of the metal layer 225 to be more difficult, thereby prolonging the etching process time of the metal layer 225, and reducing the productivity of the entire array substrate 200 and the display panel 100, and the first molybdenum nitride layer 2255 and the second molybdenum nitride layer 2256 have poor adsorption effect on the passivation layer 227, so that the molar mass of nitrogen in the first molybdenum nitride layer 2255 and the second molybdenum nitride layer 2256 can be lower than that of nitrogen in the third molybdenum nitride layer 2257, in this way, the first molybdenum nitride layer 2255 and the second molybdenum nitride layer 2256 are easier to etch, which can improve the etching efficiency of the entire metal layer 225 and improve the productivity of the array substrate 200.

Figure 12:
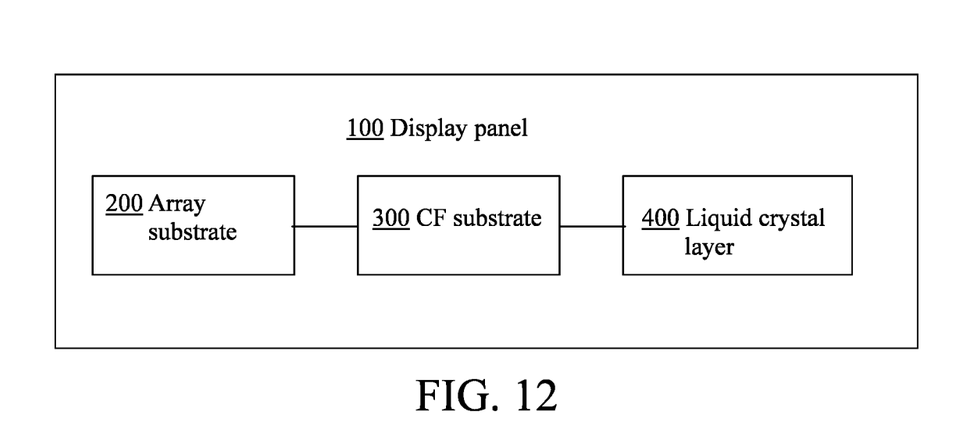
FIG. 12 is a schematic diagram of a display panel according to another embodiment of the present application.

FIG. 12 is a schematic diagram of a display panel 100. As shown in FIG. 12, another embodiment of the present application discloses a display panel 100, including a CF substrate 300, a liquid crystal layer 400 and the array substrate 200, where the CF substrate 300 and the array substrate 200 are disposed oppositely, and the liquid crystal layer 400 is filled between the CF substrate 300 and the array substrate 200.

It should be noted that, the limitation of the steps involved in this solution, without affecting the implementation of the specific solution, is not determined to limit the sequence of steps, and the previous steps may be executed first, later, or even simultaneously, and shall be deemed to fall within the scope of the present application as long as the solution can be implemented.

The technical scheme of the present application can be widely used in various display panels, such as Twisted Nematic (TN) display panels, In-Plane Switching (IPS) display panels, Vertical Alignment (VA) display panels and Multi-Domain Vertical Alignment (MVA) display panels, and, of course, other types of display panels, such as Organic Light-Emitting Diode (OLED) display panels.

The above content is a further detailed description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A manufacturing method for an array substrate, comprising:
   forming a base layer;
   forming a semiconductor layer on the base layer;
   forming a metal layer on the semiconductor layer, wherein a upper surface of the metal layer comprises a first nitride or a first oxide;
   etching the metal layer into a source/drain electrode;
   forming a passivation layer on the source/drain electrode, wherein the passivation layer is a second nitride structure corresponding to the first nitride or a second oxide structure corresponding to the first oxide;
   etching the passivation layer to form a contact hole in the passivation layer; and
   forming a transparent electrode layer on the passivation layer thus allowing the transparent electrode layer to be electrically connected to the drain electrode through the contact hole;
   wherein the metal layer comprises a metal base layer disposed on the semiconductor layer, and a first nitride layer disposed on the metal base layer, wherein the first nitride layer is a molybdenum nitride layer; wherein the step of forming a metal layer on the semiconductor layer, and wherein the upper surface of the metal layer contains a first nitride or a first oxide, comprises steps of:
   depositing a metal material base layer on the semiconductor layer;
   introducing nitrogen while depositing a molybdenum material on the metal material base layer for reaction to form a molybdenum nitride material; and
   etching the metal material base layer to form a metal base layer and etching the molybdenum nitride material to form a molybdenum nitride layer;
   wherein the step of introducing nitrogen while depositing a molybdenum material on the metal material base layer for reaction to form a molybdenum nitride material comprises steps of introducing nitrogen at a first flow rate while depositing the molybdenum material on the metal material base layer for reaction to form a first molybdenum nitride material, introducing nitrogen at a second flow rate for reaction to form a second molybdenum nitride material, and introducing nitrogen at a third flow rate for reaction to form a third molybdenum nitride material;
   the step of etching the metal material base layer to form a metal base layer and etching the molybdenum nitride material to form a molybdenum nitride layer comprises steps of etching the first molybdenum nitride material to form a first molybdenum nitride layer, etching the second molybdenum nitride material to form a second molybdenum nitride layer, and etching the third molybdenum nitride material to form a third molybdenum nitride layer; and
   the third flow rate is greater than the first flow rate and the second flow rate.

2. The manufacturing method according to claim 1, wherein the first flow rate, the second flow rate and the third flow rate are between 200 ml/min and 1000 ml/min.

3. The manufacturing method according to claim 2, wherein the second flow rate is less than the third flow rate and greater than the first flow rate.

4. The manufacturing method according to claim 1, wherein the first molybdenum nitride layer, the second molybdenum nitride layer and the third molybdenum nitride layer have the identical thickness.

5. The manufacturing method according to claim 1, wherein the third molybdenum nitride layer is thicker than the first molybdenum nitride layer and the second molybdenum nitride layer.

6. The manufacturing method according to claim 1, wherein the molybdenum nitride layer has a thickness of 10 nm.

7. An array substrate, comprising:
   a base layer;
   a semiconductor layer, disposed on the base layer;
   a metal layer, disposed on the semiconductor layer and etched into a source/drain electrode, wherein the upper surface of the metal layer contains a first nitride or a first oxide; and
   a passivation layer, disposed on the source/drain electrode, wherein the passivation layer is a second nitride structure corresponding to the first nitride or a second oxide structure corresponding to the first oxide; wherein the passivation layer is etched to form a contact hole in the passivation layer; and
   a transparent electrode layer, disposed on the passivation layer and electrically connected to the drain electrode through the contact hole;
   wherein the metal layer comprises a metal base layer and a molybdenum nitride layer, the metal base layer is disposed on the semiconductor layer, the molybdenum nitride layer is disposed on the metal base layer and fitted to the passivation layer, and the passivation layer is a nitride structure;
   wherein the molybdenum nitride layer comprises a first molybdenum nitride layer, a second molybdenum nitride layer and a third molybdenum nitride layer;
   wherein the first molybdenum nitride layer is disposed on the metal base layer, the second molybdenum nitride layer is disposed on the first molybdenum nitride layer, the third molybdenum nitride layer is disposed on the second molybdenum nitride layer, the molar mass of nitrogen in the first molybdenum nitride layer is less than that of nitrogen in the second molybdenum nitride layer, and the molar mass of nitrogen in the second molybdenum nitride layer is less than that of nitrogen in the third molybdenum nitride layer.

8. The array substrate according to claim 7, wherein the base layer comprises a substrate, a gate metal layer and a gate insulating layer stacked in sequence.

9. A display panel, comprising a color filter (CF) substrate and an array substrate arranged oppositely, and a liquid crystal layer arranged between the CF substrate and the array substrate, wherein the array substrate comprises:
- a base layer;
- a semiconductor layer, disposed on the base layer;
- a metal layer, disposed on the semiconductor layer and etched into a source/drain electrode, wherein the upper surface of the metal layer contains a first nitride or a first oxide; and
- a passivation layer, disposed on the source/drain electrode, wherein the passivation layer is a second nitride structure corresponding to the first nitride or a second oxide structure corresponding to the first oxide;
- wherein the passivation layer is etched to form a contact hole in the passivation layer; and
- a transparent electrode layer, disposed on the passivation layer and electrically connected to the drain electrode through the contact hole;
- wherein the metal layer comprises a metal base layer and a molybdenum nitride layer, the metal base layer is disposed on the semiconductor layer, the molybdenum nitride layer is disposed on the metal base layer and fitted to the passivation layer, and the passivation layer is a nitride structure;
- wherein the molybdenum nitride layer comprises a first molybdenum nitride layer, a second molybdenum nitride layer and a third molybdenum nitride layer;
- wherein the first molybdenum nitride layer is disposed on the metal base layer, the second molybdenum nitride layer is disposed on the first molybdenum nitride layer, the third molybdenum nitride layer is disposed on the second molybdenum nitride layer, the molar mass of nitrogen in the first molybdenum nitride layer is less than that of nitrogen in the second molybdenum nitride layer, and the molar mass of nitrogen in the second molybdenum nitride layer is less than that of nitrogen in the third molybdenum nitride layer.

10. The manufacturing method for an array substrate according to claim 1, wherein the semiconductor layer comprises an active layer and an ohmic contact layer.

11. The manufacturing method for an array substrate according to claim 1, wherein the semiconductor layer includes only an active layer.

12. The manufacturing method for an array substrate according to claim 1, wherein the step of introducing nitrogen while depositing a molybdenum material on the metal material base layer for reaction to form a molybdenum nitride material is performed through a plasma process, which is performed by Plasma Enhanced Chemical Vapor Deposition (PECVD).

13. The manufacturing method for an array substrate according to claim 1, wherein a molar mass of nitrogen in the first molybdenum nitride layer is less than that of nitrogen in the second molybdenum nitride layer, and a molar mass of nitrogen in the second molybdenum nitride layer is less than that of nitrogen in the third molybdenum nitride layer.

* * * * *